(12) United States Patent
Wagner et al.

(10) Patent No.: US 11,923,303 B2
(45) Date of Patent: Mar. 5, 2024

(54) CARRIER, ASSEMBLY WITH A CARRIER, AND METHOD FOR PRODUCING A CARRIER

(71) Applicant: OSRAM Opto Semiconductors GmbH, Regensburg (DE)

(72) Inventors: Konrad Wagner, Regensburg (DE); Michael Förster, Altenthann (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 254 days.

(21) Appl. No.: 17/297,405

(22) PCT Filed: Dec. 5, 2019

(86) PCT No.: PCT/EP2019/083863
§ 371 (c)(1),
(2) Date: May 26, 2021

(87) PCT Pub. No.: WO2020/120287
PCT Pub. Date: Jun. 18, 2020

(65) Prior Publication Data
US 2022/0037263 A1 Feb. 3, 2022

(30) Foreign Application Priority Data
Dec. 12, 2018 (DE) .......................... 102018131954.1

(51) Int. Cl.
*H01L 23/532* (2006.01)
*H01L 21/60* (2006.01)
(Continued)

(52) U.S. Cl.
CPC ........ *H01L 23/53228* (2013.01); *H01L 21/60* (2021.08); *H01L 23/3677* (2013.01); *H01L 23/5226* (2013.01); *H01L 23/528* (2013.01)

(58) Field of Classification Search
CPC .... H05K 1/0204; H05K 1/113; H05K 3/0061; H05K 2201/09054; H05K 2201/09363;
(Continued)

(56) References Cited

U.S. PATENT DOCUMENTS

2003/0136577 A1 7/2003 Abe
2007/0290327 A1* 12/2007 Nakasato ............... H05K 3/445
257/E23.006
(Continued)

FOREIGN PATENT DOCUMENTS

| DE | 102015112536 A1 | 2/2017 |
|---|---|---|
| DE | 102017126268 A1 | 5/2019 |
| JP | 61-287130 A | 12/1986 |

OTHER PUBLICATIONS

International Search Report issued for PCT/EP2019/083863 dated Feb. 28, 2020.

*Primary Examiner* — Galina G Yushina
(74) *Attorney, Agent, or Firm* — ArentFox Schiff LLP (57) ABSTRACT

A carrier comprises: a main body made of a material comprising a thermal conductivity of at least 380 W/(m K), wherein the main body comprises a mounting surface for mechanical and thermal connection with a component, wherein the main body comprises a recess which penetrates the main body along a first direction perpendicular to the main extension plane of the main body, an electrically insulating filler is arranged in the recess, which comprises a further recess penetrating the filler along the first direction, an inner wall of the filler surrounding the further recess is provided with an electrically conductive coating to form a via through the main body.

12 Claims, 5 Drawing Sheets

(51) Int. Cl.
*H01L 23/367* (2006.01)
*H01L 23/522* (2006.01)
*H01L 23/528* (2006.01)

(58) Field of Classification Search
CPC ......... H05K 2201/09509; H05K 3/445; H05K 3/421; H05K 2201/10106; H01L 23/53228; H01L 21/60; H01L 23/3677; H01L 23/5226; H01L 23/528; H01L 33/642; H01L 23/49827; H01L 33/484; H01L 23/142
See application file for complete search history.

(56) References Cited

U.S. PATENT DOCUMENTS

| | | |
|---|---|---|
| 2009/0261375 A1 | 10/2009 | Chen et al. |
| 2010/0246140 A1 | 9/2010 | Nakasato et al. |
| 2011/0104855 A1 | 5/2011 | Lin et al. |
| 2011/0156090 A1* | 6/2011 | Lin ..................... H05K 1/0204 |
| | | 257/E33.075 |
| 2013/0160978 A1* | 6/2013 | Shin ..................... H05K 3/445 |
| | | 205/199 |

* cited by examiner

CARRIER, ASSEMBLY WITH A CARRIER, AND METHOD FOR PRODUCING A CARRIER

This patent application is a 35 U.S.C.§ 371 National Phase of PCT Application No. PCT/EP2019/083863, filed Dec. 5, 2019, which claims priority to German patent application 10 2018 131 954.1, filed Dec. 12, 2018, the disclosure contents of which are hereby incorporated by reference herein.

A carrier and an assembly with a carrier and a substrate are specified. In addition, a method for producing a carrier is specified.

According to at least one embodiment, the carrier is a mechanically self-supporting component. In particular, the carrier is a carrier for an electronic component. The carrier is then in particular designed to mechanically support, carry, make electrically conductive contact with and/or make thermally conductive contact with at least one electronic component. For example, an electronic component can be mounted on a mounting surface of the carrier and can be contacted in an electrically conductive manner by means of the carrier. In particular, the carrier may be configured to dissipate heat generated during operation of an electronic component mounted on the carrier from the electronic component. In particular, the carrier is particularly suitable for optoelectronic components such as light-emitting diodes, light-emitting diode chips, laser diodes or laser diode chips in order to make electrically conductive contact therewith and to dissipate heat generated during operation.

According to at least one embodiment, the carrier comprises a main body. The main body is formed of a material that comprises a thermal conductivity of at least 380 W/(m K). For example, the main body comprises a material having a thermal conductivity of at least 390 W/(m K). For example, the main body comprises a material having a thermal conductivity of at least about 400 W/(m K). For example, the main body comprises a material having a thermal conductivity at least as good as the thermal conductivity of copper. In particular, the main body is formed of a metal. For example, the main body is formed of a copper. For example, the main body is formed of copper. For example, the main body is formed of at least 99.8% Cu. Thus, a sufficiently high thermal conductivity of the main body can be realized.

According to at least one embodiment, the main body comprises a mounting surface. The mounting surface is used for mechanical and thermal connection with a component. The component, for example an optoelectronic device, can be attached to the mounting surface so that heat generated during operation can be coupled into the main body by means of the mounting surface and can be dissipated. Furthermore, the mounting surface is designed to mechanically support and stabilize the component.

According to at least one embodiment, the main body comprises a recess. The recess penetrates the main body along a first direction perpendicular to the main extension plane of the main body. In the main extension plane, the carrier comprises a larger extension than transverse to the main extension plane along the first direction. In particular, the first direction extends perpendicular to the mounting surface. The recess is introduced into the main body by means of ears, for example. The recess penetrates the main body along the first direction, in particular completely. The recess comprises, for example, a round shape in a cross section in the main extension plane. Other shapes are also possible.

According to at least one embodiment, an electrically insulating filler is arranged in the recess. In particular, the electrically insulating filler is in direct contact with the main body surrounding the recess. The main body is electrically insulated at the recess by means of the electrically insulating filler, so that no or no substantial current flow is possible from the main body through the electrically insulating filler. The electrically insulating filler is formed, for example, with a polymer or a ceramic. In particular, the filler is introduced into the recess by means of a printing process.

According to at least one embodiment, the filler comprises a further recess. The further recess penetrates the filler along the first direction, in particular completely. The recess and the further recess are formed in particular concentrically or almost concentrically. The further recess is introduced into the filler by means of drilling, for example. A diameter of the further recess is in particular smaller than a diameter of the recess. In particular, the recess is completely surrounded by the insulating filler in cross section in the main extension plane. Along the first direction, the further recess is open at the first end and the second end. The further recess is electrically insulated from the main body by means of the filler.

According to at least one embodiment, an inner wall of the filler surrounds the further recess. The inner wall comprises, for example, the shape of a cylindrical surface.

According to at least one embodiment, the inner wall is provided with an electrically conductive coating. For example, the electrically conductive coating comprises copper or is formed from copper. For example, the electrically conductive coating is galvanically applied to the inner wall of the filler. The electrically conductive coating extends through the main body in the further recess along the first direction. The electrically conductive coating is spaced from the main body. The filler separates the main body and the coating. The main body and the electrically conductive coating are electrically insulated from each other by means of the filler.

According to at least one embodiment, the filler and the electrically conductive coating form a via through the main body. The via is formed in the recess of the main body to electrically connect the side with the mounting surface to a side of the main body opposite along the first direction. The main body itself, in particular the region where the mounting surface is formed, is not used for electrical conduction, but primarily for dissipating heat generated by the component during operation.

The component, which is for example a high-power electronic component such as a high-power LED, produces a lot of waste heat in addition to intense light during operation. This waste heat can be efficiently dissipated by means of the carrier. As a result, the component can be operated reliably and, for example, a desired brightness can be achieved. In addition, the carrier enables integration into an assembly by means of soldering.

The carrier described here is based inter alia on the following considerations. Ceramic substrates for high-power LED chips comprise, for example, several contact pads on their underside for electrical contacting as well as a contact pad for thermal contacting. Alternatively, metal alloy substrates are used. These comprise pads that combine thermal and electrical contact within themselves. In addition, alloys often comprise a lower thermal conductivity coefficient, in particular a thermal conductivity coefficient of less than 200 W/(m K). The thickness is also usually limited to less than 500 μm and comprises reduced thermal spreading and mechanical stability compared to a metal core board.

The carrier described here now makes use, inter alia, of the idea that a carrier made of a pure copper with a sufficient thickness comprises very good thermal properties. In addition, fixing by means of screws or clamps can be dispensed with. The carrier described here thus combines the advantages of the ceramic substrate, a metal alloy substrate and a metal core board. The main body is formed mainly of pure copper. Along the first direction, the main carrier comprises a thickness sufficient to dissipate sufficient heat during operation as desired. For example, the thickness is in the range of 1 mm, for example between 0.75 and 1.25 mm. Due to the via being electrically insulated from the main body by means of the coating, the thermal connection of the carrier and the electrical connection are designed separately from each other.

In particular, a plurality of electrical contact points and a thermal coupling surface separated therefrom can be realized. The carrier thus comprises a high thermal conductivity and can be soldered for electrical and thermal connection. Thus a surface mountable carrier is formed (SMC). The carrier with the main body made of pure copper in particular comprises a thermal conductivity of about 400 W/(m K). This is significantly higher than that of ceramic substrates or conventional leadframes. The carrier can also be contacted electrically and thermally by means of soldering, which distinguishes the carrier in particular from conventional copper-based metal core substrates.

According to at least one embodiment, the carrier comprises an electrical contact pad for electrically coupling with the component. The contact pad is electrically isolated from the main body. The contact pad is electrically connected with the coating. The contact pad can thus be electrically contacted from a side of the carrier facing away from the mounting side by means of the via. The electrical contact pad for electrically coupling the component is formed separately from the mounting surface for thermal coupling with the component.

According to at least one embodiment, the main body comprises a first plane oriented in the same direction as the main extension plane. The mounting surface is arranged in the first plane. The contact pad is offset from the first plane along the first direction. Thus, the mounting surface and the contact pad are arranged offset from each other along the first direction. Thus, electrical insulation is provided between the main body with the mounting surface and the contact pad.

According to at least one embodiment, an electrically insulating material is arranged along the first direction between the contact pad and the main body. As a result, the contact pad is electrically insulated from the main body. Furthermore, the electrically insulating material causes the offset arrangement of the contact pad with respect to the mounting surface. The electrically insulating material is, for example, a polymer or another dielectric.

According to at least one embodiment, the mounting surface is arranged on a protruding region protruding over the first plane along the first direction. The main body comprises the protruding region. Lateral to the mounting surface at the protruding region, the contact pad is formed in particular in the same plane as the mounting surface. Between the contact pad and the main body, which is recessed laterally adjacent to the protruding region compared to the protruding region, the insulating material is arranged. As a result, the contact pad is electrically insulated from the main body and the mounting surface.

According to at least one embodiment, the carrier comprises an electrically conductive contact point. The electrically conductive contact point is arranged on a side of the main body facing away from the mounting surface. The contact point is electrically insulated from the main body. The contact point is electrically conductively connected with the coating. The contact point forms an electrical contact between the carrier and a further substrate. The electrical contact point is in particular solderable, i.e. electrically conductively connectable with the further substrate, for example by means of soldering. The electrically conductive contact point is electrically conductively connected by means of the coating with the contact pad. The via enables the electrically conductive contact point to be formed on the side facing away from the mounting surface, and the contact pad to be formed on the side facing the mounting surface.

According to at least one embodiment, an inner space of the via is laterally delimited by the coating. The coating surrounds an inner space. According to exemplary embodiments, the inner space is hollow or filled with air. According to further embodiments, the inner space is filled with a further filler. The further filler prevents solder or other elements from penetrating into the vias, in particular into the inner space, especially during manufacture.

According to at least one embodiment, the carrier comprises a plurality of vias formed to correspond to one another. In particular, the vias are each formed as described herein and comprise the filler and the coating, respectively.

An assembly is further specified which comprises a carrier and a substrate. In particular, the assembly comprises a carrier as described herein. All features and advantages applicable to the carrier are also applicable to the carrier of the assembly, and vice versa.

According to at least one embodiment, the carrier is attached to the substrate on a side of the main body facing away from the mounting surface. The substrate comprises at least one conductor path and at least one heat sink. The main body is thermally conductively connected directly to the heat sink. The coating is electrically conductively connected with the conductor path. In particular, the carrier and the substrate are connected to each other by means of soldering. In particular, a large-area connection of the main body to the heat sink is realized. Thus, a reliable dissipation of heat occurring during operation by means of the carrier into the substrate is possible. For example, the substrate comprises copper or is formed from copper.

For example, the assembly comprises a plurality of carriers in direct contact with a common substrate. For example, by means of the substrate, both electrical contacting and thermal contacting of the carriers and the electronic components arranged on the carrier is possible.

A method for producing a carrier is further specified. With the method, it is possible in particular to manufacture a carrier described herein. Accordingly, all features and advantages described for the carrier are also valid for the method and vice versa.

According to at least one embodiment, main body is provided from a material comprising a thermal conductivity of at least 380 W/(m K). The main body comprises a mounting surface for mechanical and thermal connection with a component. A recess is introduced into the main body completely along a first direction perpendicular to the main extension plane of the main body. For example, the recess is drilled into the main body. The recess extends completely through the main body.

According to at least one embodiment, an electrically insulating filler is introduced into the recess. For example, the electrically insulating filler comprises a polymer. For example, the electrically insulating filler is printed into the recess. For example, the insulating filler initially completely fills the recess.

According to at least one embodiment, a further recess is introduced into the filler completely along the first direction. For example, the further recess is introduced into the filler by means of drilling. The further recess extends completely through the filler.

According to at least one embodiment, the further recess is surrounded by an inner wall of the filler. The inner wall of the filler is coated with an electrically conductive coating. For example, the inner wall is electroplated. Thus, according to at least one embodiment, a via is formed through the main body. The electrically conductive coating is electrically insulated from the main body. Is realized by bringing the electrically insulating filler into the recess of the main body, into which in turn the further recess is introduced. The electrically insulating filler thus separates the main body from the conductive coating.

According to at least one embodiment, providing the main body comprises forming the mounting surface of the main body on a protruding region of the main body along the first direction. Electrically insulating material is laterally arranged to the side of the protruding region. A contact pad is formed on a side of the electrically insulating material opposite the main body. The contact pad is formed to be electrically connected with the coating. Thus, it is possible to manufacture the carrier such that the contact pad and the mounting surface are electrically separated from each other. Thus, the thermal connection and the electrical connection are realized separately from each other.

According to at least one embodiment, providing the main body comprises coating a main surface of the main body with an electrically insulating material. The electrically insulating material is removed in a region. This exposes the mounting surface of the main body. A contact pad is formed on a side of the electrically insulating material facing away from the main body. The contact pad is connected with the coating. Thus, a separation of the electrical connection and the thermal connection to the carrier is realized.

According to at least one embodiment, a coupling surface is formed on a side of the main body facing away from the mounting surface. The coupling surface is used for direct connection of the main body to a heat sink of a substrate.

According to at least one embodiment, providing the main body comprises providing the main body of copper. In particular, the main body comprises almost entirely or entirely pure copper, for example 99.8% or more copper.

Further advantages, features and further embodiments result from the following exemplary embodiments explained in connection with the figures. Identical, similar and similar-acting elements may be provided therein with the same reference signs. The figures and the proportions of the elements shown in the figures are not to be regarded as to scale. Rather, individual elements may be shown exaggeratedly large for better representability and/or for better comprehensibility.

Showing in.

Figure 1:
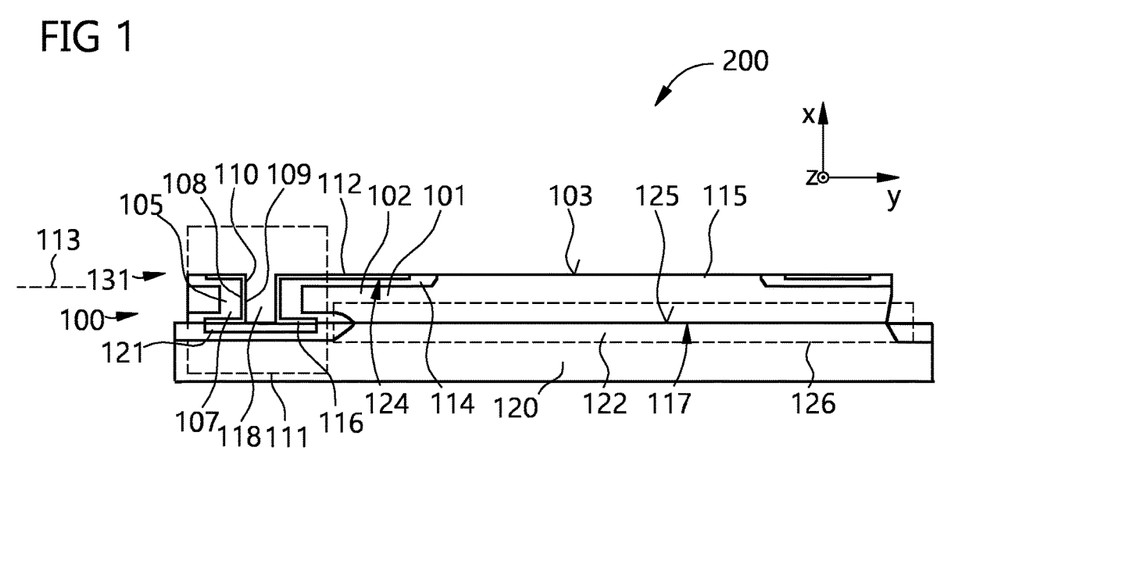
FIG. 1 a schematic representation of an assembly according to an exemplary embodiment, FIG. 2 a schematic representation of a carrier according to an exemplary embodiment, FIG. 3 a schematic sectional view of a carrier according to an exemplary embodiment, FIG. 4 a schematic representation of a detail of the carrier according to FIG. 3, FIG. 5 a schematic representation of a carrier according to an exemplary embodiment, FIG. 6 a schematic representation of an assembly according to an exemplary embodiment, FIG. 7 a schematic sectional view of an assembly according to an exemplary embodiment, FIG. 8 a schematic sectional view of an assembly according to an exemplary embodiment, FIG. 9 a schematic representation of a carrier according to an exemplary embodiment, and FIG. 10 a schematic sectional view of a carrier according to an exemplary embodiment.

FIG. 1 shows a schematic representation of an assembly 200. The assembly 200 comprises a carrier 100 and a substrate 120.

The carrier 100 and the substrate 120 are connected to each other, for example by means of a solder joint. The solder joint comprises, for example, a solder 127.

In particular, the carrier 100 is designed to electrically and thermally contact an electronic component 300 (FIG. 5), for example an optoelectronic component such as an LED or an LED chip.

The carrier 100 comprises a main body 101. The main body 101 is formed of copper and consists essentially of pure copper. This results in a thermal conductivity of the main body 101 of at least 380 W/mK, in particular of about 400 W/mK. A material 102 of the main body 101 is selected to result in the sufficiently high thermal conductivity. In particular, the material 102 is copper or at least 99.8% copper, for example at least 99.9% copper.

The main body 101 comprises a mounting surface 103. The mounting surface 103 serves to carry the component 300. The mounting surface 103 forms a mechanical as well as thermal interface between the main body 101 and the component 300.

For electrical contacting of the component 300, the carrier 100 comprises at least one contact pad 112, in particular a plurality of contact pads 112.

The contact pad 112 is electrically conductively connected with an electrically conductive coating 110. In particular, the contact pad 112 and the coating 110 are at least partially in direct contact with each other. The coating 110 extends along a first direction x through the main body 101 to a side 117 of the main body 101 remote from the mounting surface 103.

At the side 117, the coating 110 is electrically conductively connected with a contact point 116. The contact point 116 serves to make electrical contact with the carrier 100. The side of the main body 101 on which the mounting surface 103 is formed and the side 117 of the main body 101 remote therefrom are thus electrically connected to one another by means of a via 111. In particular, the via 111, the contact pad 112 and the contact point 116 are each electrically insulated from the mounting surface 103 and the main body 101.

The main body 101 comprises a recess 105. The recess 105 completely penetrates the main body 101 along the x-direction. The main body 101 comprises a main extension plane 131, which is particularly spanned by the y-direction and z-direction. Transversely, the main body 101 is penetrated by the recess 105.

The recess 105 is at least partially filled with an electrically insulating filler 107. The filler 107 is, for example, a plastic or other electrically insulating material. The filler 107 is introduced into the recess 105, for example, so that the filler 107 initially completely fills the recess 105.

A further recess 108 is introduced into the filler 107. The further recess 108 completely penetrates the filler 107 along the first direction x. For example, the further recess 108 is drilled or otherwise introduced into the filler 107 so that the filler 107 is completely penetrated along the first direction. An inner wall of the filler 109 laterally surrounds the further recess 108 in the y-direction and in the z-direction.

The inner wall of the filler 109 is coated with the coating 110. The coating 110 in the further recess 108 thus comprises the shape of a cylindrical surface. In particular, the further recess 108 is hollow within the coating 110. The coating 110 surrounds an inner space 118. The inner space 118 extends through the main body 101, in particular along the first direction. The coating 110 thus provides an electrically conductive connection along the first direction x through the main body 101. This electrically conductive connection is electrically isolated from the main body 101. By means of the via 111, the carrier is thus formed as a surface-mountable component. Both the electrical contact at the contact point 116 and a coupling surface 125 for thermal connection of the carrier 100 are formed on the side 117.

The main body 101 is sufficiently large in size to provide sufficient heat dissipation from the component 300 to the substrate 120. Both the selection of the material 102 and the geometry of the main body 101 allow for sufficiently good heat dissipation during operation of the component 300.

In the exemplary embodiment of FIG. 1, the mounting surface 103 is disposed on a protruding region 115 of the main body 101. A first plane 113 of the main body 101 is offset along the x-direction from the mounting surface 103. The first plane 113 is coated, for example, laterally of the protruding region 115 with an electrically insulating material 114. Along the first direction x, contact pad 112 is disposed on a side 124 of the electrically insulating material 114 facing away from the main body 101. Along the first direction x, the insulating material 114 is thus disposed between the contact pad 112 and the main body 101.

Due to the arrangement of the mounting surface 103 on the protruding region 115, the mounting surface 103 and the contact pad 112 are nevertheless arranged along the first direction x in a common plane at the same level. In the plane, insulating material 114 is also arranged between the mounting surface 103 and the contact pad 112. At this point, it is also possible to dispense with the insulating material 114.

In the y-z plane, the contact pad 112 and the protruding region 115 are spaced apart with the mounting surface 103 so that the contact pad 112 and the mounting surface 103 are electrically insulated from each other. Along the first direction, the contact pad 112 and the main body 101 are electrically insulated from each other by means of the insulating material 114.

The substrate 120 comprises a conductor path 121. This is connectable to a voltage source, for example. The substrate 120 also comprises a heat sink 122. This serves in particular to dissipate heat occurring during operation.

The carrier 100 is connected to the conductor path 121 with the contact point 116. The contact point 116 and the conductor path 121 are directly connected to one another in an electrically conductive manner. For example, the conductor path 121 provides a power supply to the component 300.

The main body 101 is directly connected to the heat sink 122 at the coupling surface 125. Between the coupling surface 125 and the heat sink 122, for example, the solder 127 is assembled to realize the mechanical connection and a thermally conductive connection between the carrier 100 and the substrate 102. Thus, a thermal connection 126 is formed between the carrier 100 and the substrate 120. This is large enough in area and conductive enough to be able to realize the desired high heat transfer.

The component 300 is attachable to the mounting surface 103, for example the component 300 is connected to the carrier 100 by means of gold-tin thin film soldering. At the mounting surface 103, the mechanical connection with the component 300 and the thermal connection are realized. Along the first direction x below the component 300, heat spreading is achieved by means of the main body 101. The carrier 100 is thermally connected to the substrate 102 over a large area downwards by means of the coupling surface 125.

Electrical contact is made on the upper side of the carrier 101 by copper applied to the dielectric 114, which forms the contact pad 112. For example, the electrical connection between the contact pad 112 and the component 300 is made by wire-bonding.

The recess 105 is introduced into the main body 101. This is filled with the dielectric 107. Then the dielectric 107 is drilled through again. After that, the coating 110 is metallized. Thus, a continuous electrical contact is realized from the upper side to the underside 117 of the carrier 100. In doing so, it is particularly avoidable to set the electrical potential of the thermal mounting surface 103.

The connection between the carrier 100 and the substrate 120 is made, for example, by means of vapor phase soldering. Here, for example, a tin solder 127 is used. The substrate 120 is, for example, a metal core board. The carrier 100 enables thermal and electrical bonding of the component 300 based on the main body 101 made of copper. Through this, a sufficiently high heat transport and a good mechanical stability can be achieved. In addition, a surface-mountable carrier 100 can be realized.

Figure 2:
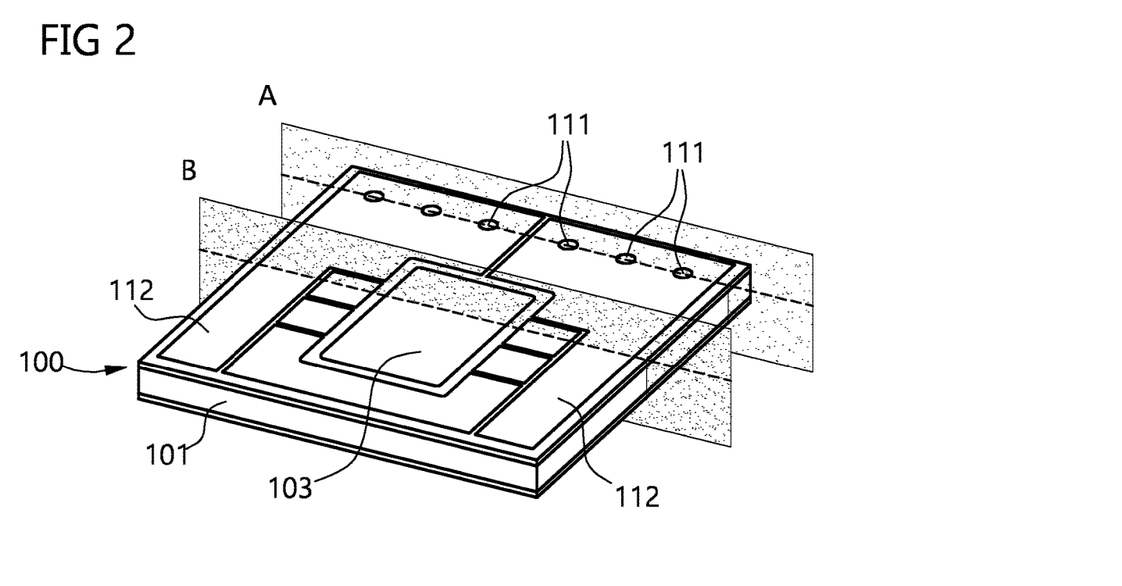

FIG. 2 shows a perspective view of the carrier 100. The mounting surface 103 is realized centrally. Two contact pads 112 are provided, which are electrically isolated from each other. Each contact pad 112 comprises a plurality of vias 111, in particular all of which are formed to correspond to the vias 111, as described in connection with FIG. 1. In FIG. 2, three vias 111 are shown per contact pad 112. More or fewer vias 111 may also be provided.

Figure 3:
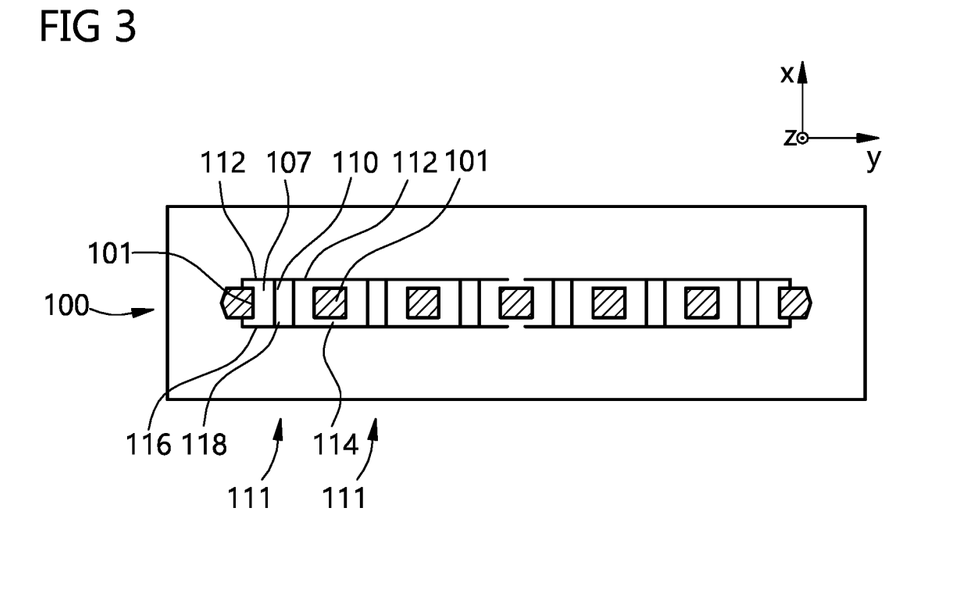

FIG. 3 shows a sectional view of the carrier 100 along plane A of FIG. 2.

The vias 111 extend along the first direction x completely through the main body 101. Thereby, the contact pad 112 is electrically insulated from the material 102 of the main body 101 by means of the insulating material 114. The coating 110 is electrically insulated from the material 102 by means of the filler 107. In the yz-plane, along the direction y, the main body 101 is arranged first. This is followed by the filler 107. This is followed by the coating 110. This is followed by the inner space 118. This is followed again by the coating 110. This is followed again by the filler 107. This is followed by material 102 of the main body 101. Correspondingly, all vias 111 are formed.

Figure 4:
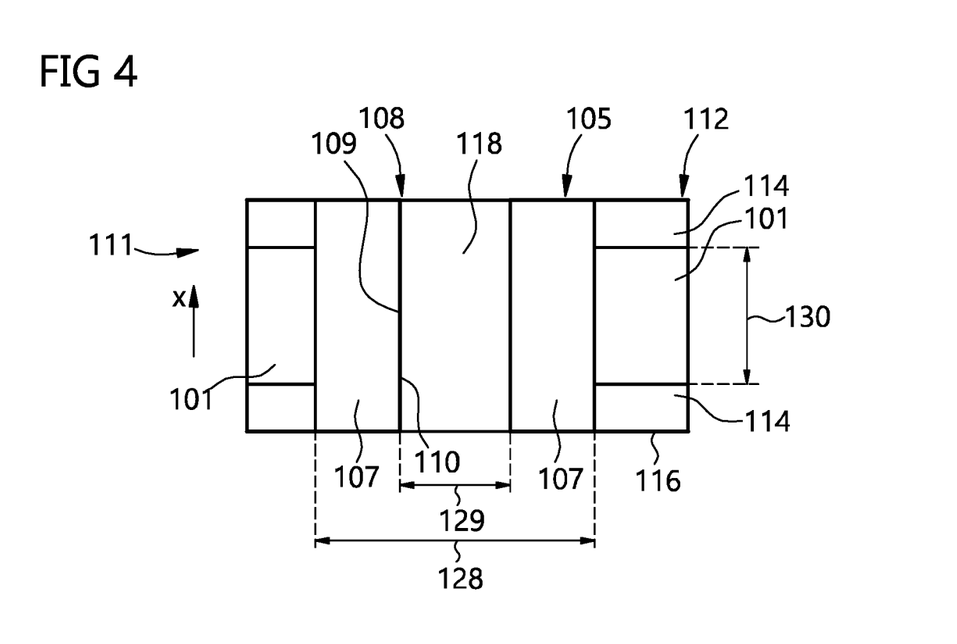

FIG. 4 shows a detailed representation of a via 111 according to an exemplary embodiment.

The recess 105 comprises a first diameter 128. In particular, the first diameter 128 is in the millimeter range. For example, the first diameter comprises a value of 1.5 to 3 mm, for example 2.5 mm.

The further recess 108 comprises a second diameter 129. The second diameter 129 is smaller than the first diameter 128. For example, the first diameter 128 is twice the size of the second diameter 129. For example, the first diameter 128 is larger than the second diameter 129 by a factor of 1.5 to a factor of 3. For example, the second diameter 129 is in a range of 0.5 mm to 1 mm.

The main body 101 comprises a thickness 130 along the first direction x. The thickness 130 is about 1 mm, for example, between 0.8 and 2 mm. Along the x-direction above and below the main body 101, electrically insulating material 114 is laterally arranged adjacent the mounting surface 103.

Figure 5:
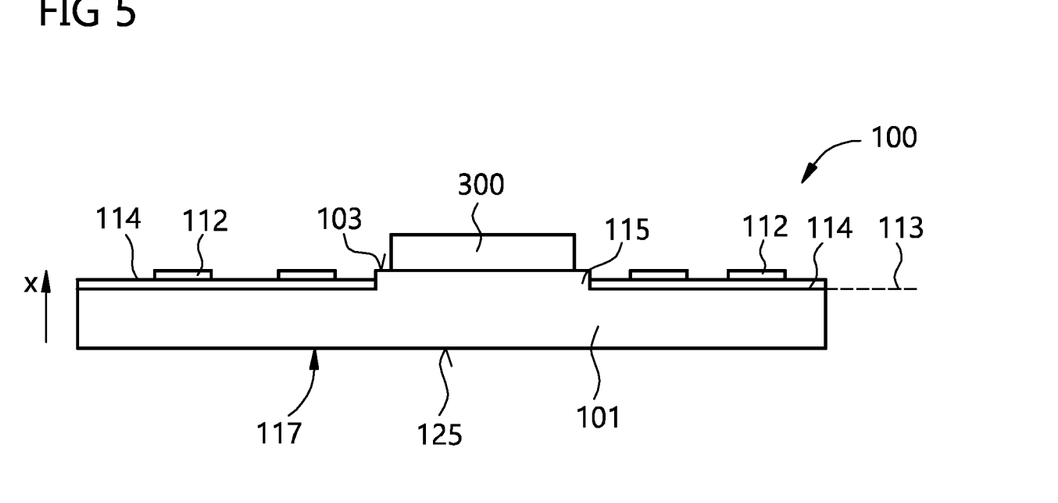

FIG. 5 shows a sectional view along the plane B of FIG. 2. In addition, the component 300 is shown schematically.

Along the first direction x, the contact pads 112 are each spaced from the first plane 113 of the main body 101. Along the first direction x, the electrically insulating material 114 is respectively disposed between the contact pads 112 and the main body 101. In the region of the mounting surface 103, the protruding region 115 of the main body 101 extends in the first direction through the insulating material 114. A plurality of patterned electrical contact pads 112, which may also be referred to as electrical conductor paths, are formed on the upper side of the carrier 100.

Multiple electrical contacts formed by means of the contact points 116, the coating 110, and the contact pads 112 may be connected in parallel.

Figure 6:
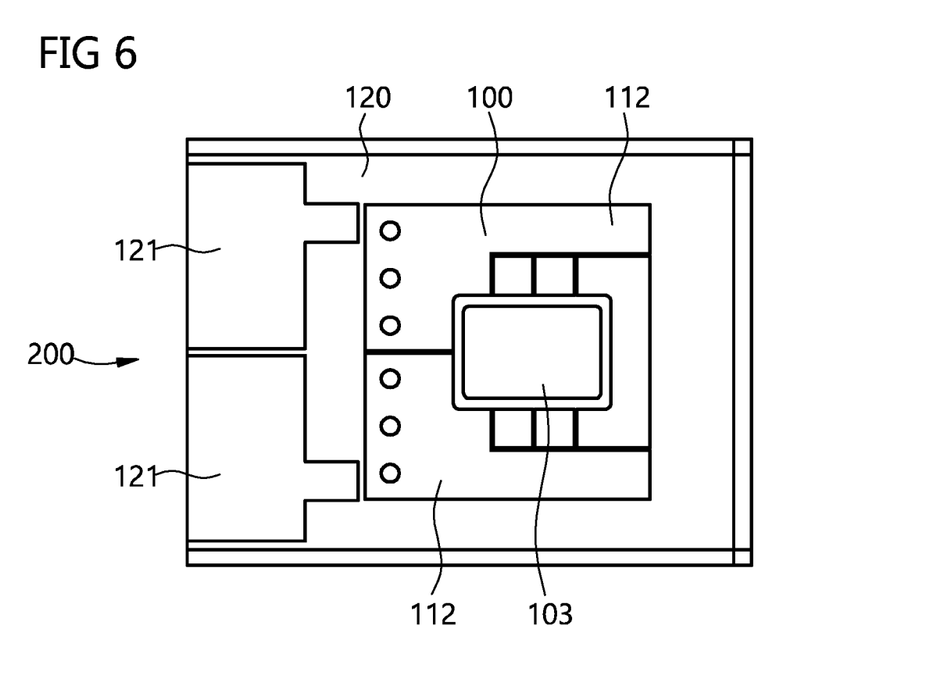

FIG. 6 shows a top view of the assembly 200 according to an exemplary embodiment. The carrier 100 is arranged on the substrate 120 and electrically connected with conductor paths 121.

Figure 7:
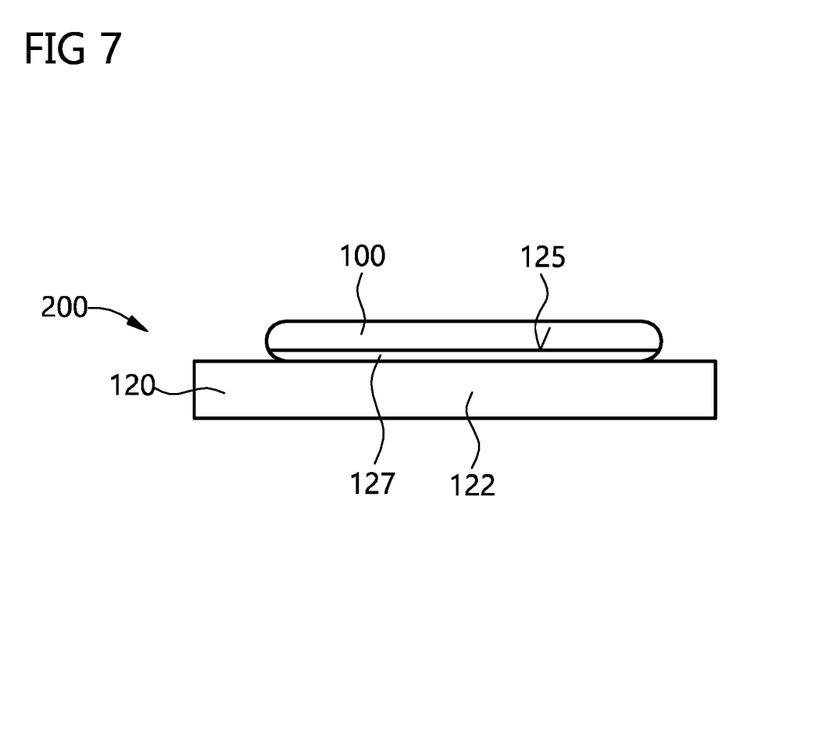

FIG. 7 shows a sectional view of the assembly 200 according to FIG. 6. The carrier 100 is thermally connected to the bath 120 by means of the solder 127 on the coupling surface 125. The electrical connection is established between the vias 111 and the conductor paths 121.

Figure 8:
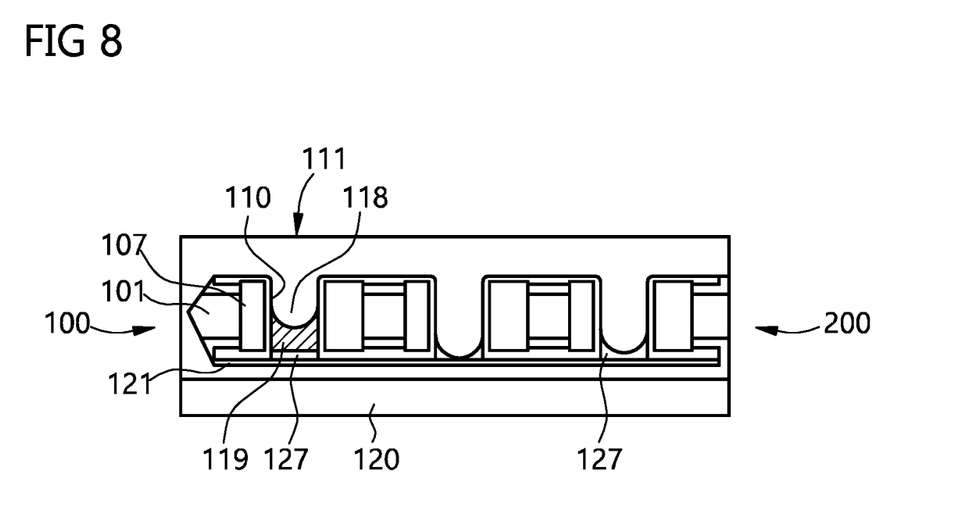

FIG. 8 shows a cross-section in the region of the vias 111. The solder 127 can penetrate into the vias 111, in particular into the inner space 118, when the inner space 118 is unfilled.

According to exemplary embodiments, a further filler 119 is provided in the inner space 118 of the vias 111. For example, the further filler 119 is pressed into the inner space to prevent penetration of the solder 127. In this way, uncontrolled spreading of the solder 127 can be avoided. In particular, this makes the alignment of the carrier 100 relative to the substrate 120 more reliable, and tilting can be avoided. However, the further filler 119 is dispensable according to further exemplary embodiments. According to exemplary embodiments, the further filler 119 is planarized with copper on the upper side and/or on the underside. Thus, the electrical connectivity is improved and a rising of the solder 127 into the inner space 118 is avoided.

Figure 9:
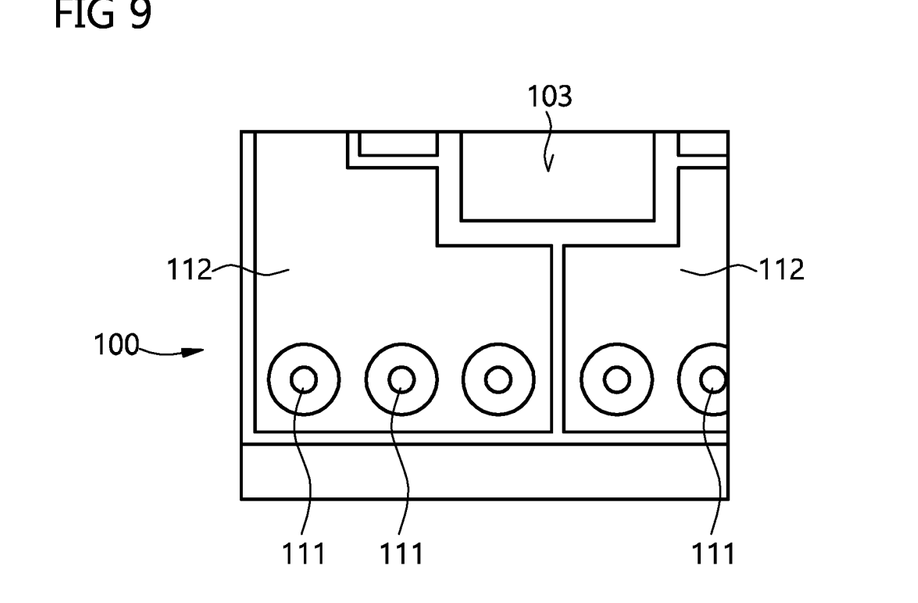
Figure 10:
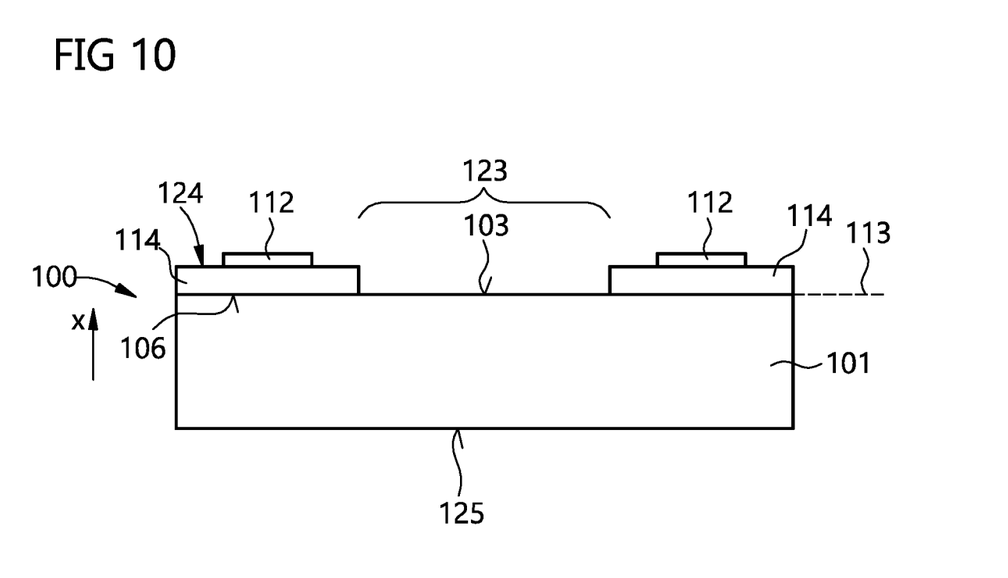

FIGS. 9 and 10 show the carrier 100 according to another exemplary embodiment. The vias 111 correspond to the vias as previously described.

In contrast to the carrier 100 according to FIGS. 1 to 8, the carrier 100 according to FIGS. 9 and 10 does not comprise a protruding region 115.

The mounting surface 103 is formed in the plane 113. The main body 101 comprises a planar main surface 106 at the mounting surface 103. Insulating material 114 is applied to the main surface 106. During manufacture, the insulating material 114 is in particular initially applied to the main surface 106 over the entire surface. Subsequently, the insulating material 114 is removed again in a region 123 to expose the mounting surface 103 again. Thus, no insulating material 114 is disposed in the region 123.

On the side 124 of the electrically insulating material 114 facing away from the main body 101, the contact pads 112 are arranged. Along the first direction x, the contact pads 112 are thus arranged spaced from the mounting surface 103. The mounting surface 103 and the contact pads 112 are arranged in different planes.

In the exemplary embodiments according to FIGS. 1 to 8, with the protruding region 115, the copper is etched to form the protruding region 115 and the region recessed thereto along the first plane 113 to form the main body 101. Then, the electrically insulating material 114 and the contact pad 112 are applied to obtain the carrier 100 with constant height at the upper side.

In contrast, in the exemplary embodiment according to FIGS. 9 and 10, the main body 101 is not etched. The electrically insulating material 114 is first applied over the entire surface of the main surface 106 of the main body 101 as a dielectric, and subsequently removed again locally to expose the access to the main body 101 made of copper. This ensures attachment of the component 300 to the main body 101 made of copper.

According to further exemplary embodiments, it is also possible to apply the electrically insulating material 114 already structured in such a way that the mounting surface 103 remains free.

The carrier 100 forms an interface for the component 300 that allows sufficiently efficient dissipation of the waste heat generated by the component 300 during operation. In this regard, the carrier 100 can be integrated into further electrical circuits such as the substrate 120 by means of soldering. Thus, a carrier 100 with very high thermal conductivity is realized, which can be soldered for electrical and thermal connection, in particular as a surface mountable component.

The invention is not limited by the description based on the exemplary embodiments. Rather, the invention encompasses any new feature as well as any combination of features, which in particular includes any combination of features in the patent claims, even if that feature or combination itself is not explicitly specified in the patent claims or exemplary embodiments.

LIST OF REFERENCE SIGNS 100 carrier
101 main body
102 material
103 mounting surface
105 recess
106 main surface
107 filler
108 further recess
109 inner wall of filler
110 coating
111 via
112 contact pad
113 first plane
114 insulating material
115 protruding region
116 contact point
117 remote side of the main body
118 inner space
119 further filler
120 substrate
121 conductor path
122 heat sink
123 region
124 side of the electrically insulating material
125 coupling surface
126 thermal connection 127 solder
128 first diameter
129 second diameter
130 thickness
131 main extension plane
200 assembly
300 component
x, y, z direction

The invention claimed is:

1. A carrier comprising:
a main body made of a material which comprises a thermal conductivity of at least 380 W/(m K), wherein the main body comprises a mounting surface for mechanical and thermal connection with a component, wherein the main body comprises a recess which penetrates the main body along a first direction perpendicular to a main extension plane of the main body,
an electrically insulating filler comprising a further recess penetrating the filler along the first direction, wherein the electrically insulating tiller is arranged in the recess,
an inner wall of the filler surrounding the further recess is provided with an electrically conductive coating to form a via through the main body, wherein the main body comprises a first plane in the same direction as the main extension plane, wherein the mounting surface is arranged on a protruding region protruding the first plane along the first direction, and wherein
an inner space laterally delimited by the coating comprises a further filler, which is planarized with a copper, and wherein the further filler is configured to prevent penetration of a solder into the via.

2. The carrier according to claim 1 comprising:
an electrical contact pad for electrically coupling with the component, wherein the contact pad is electrically isolated from the main body and that is electrically connected to the coating.

3. The carrier according to claim 2, wherein the contact pad is arranged offset from the first plane along the first direction.

4. The carrier according to claim 2, wherein an electrically insulating material is arranged along the first direction between the contact pad and the main body.

5. The carrier according to claim 1, comprising an electrically conductive contact point on a bottom side of the main body remote from the mounting surface, wherein the contact point is electrically insulated from the main body and electrically conductively connected with the coating.

6. The carrier according to claim 1, wherein the via is one of a plurality of vias formed corresponding to each other.

7. The carrier according to claim 1, wherein the material of the main body is copper.

8. An assembly comprising a substrate and the carrier according to claim 1, wherein
on a side of the main body facing away from the mounting surface, the carrier is attached to the substrate, wherein
the substrate comprises at least one conductor path and at least one heat sink, the main body is directly thermally conductively connected to the heat sink, and
the coating is electrically conductively connected with the conductor path.

9. A method for producing a carrier, comprising:
providing a main body of a material comprising a thermal conductivity of at least 380 W/(m K), wherein the main body comprises a mounting surface for mechanical and thermal connection with a component,
introducing a recess in the main body completely along a first direction perpendicular to a main extension plane of the main body,
introducing an electrically insulating filler into the recess,
introducing a further recess in the filler completely along the first direction,
coating an inner wall of the filler surrounding the further recess with an electrically conductive coating, and thereby
forming a via through the main body, Wherein providing the main body comprises:
forming the mounting surface or the main body on a protruding region of the main body along the first direction,
arranging electrically insulating material laterally to the side of the protruding region,
an inner space laterally delimited by the coating comprises a further filler, which is planarized with copper, and wherein the further filler is configured to prevent penetration of a solder into the via.

10. The method according to claim 9, Wherein providing the main body comprises:
coating a main surface of the main body with an electrically insulating material,
removing the electrically insulating material in a region, and thereby
exposing the mounting surface of the main body,
forming a contact pad on a side of the electrically insulating material facing away from the main body, which is electrically connected to the coating.

11. The method according to claim 9, further comprising:
forming a coupling surface on a side of the main body remote from the mounting surface for directly connecting the main body to a heat sink of a substrate.

12. The method according to claim 9, wherein providing the main body comprises:
providing the main body of copper.

* * * * *

UNITED STATES PATENT AND TRADEMARK OFFICE
CERTIFICATE OF CORRECTION

| | | |
|---|---|---|
| PATENT NO. | : 11,923,303 B2 | Page 1 of 1 |
| APPLICATION NO. | : 17/297405 | |
| DATED | : March 5, 2024 | |
| INVENTOR(S) | : Konrad Wagner et al. | |

It is certified that error appears in the above-identified patent and that said Letters Patent is hereby corrected as shown below:

In the Claims

Column 11, Claim 1, Line 21, delete "tiller" and substitute therefor -- filler --;

Column 12, Claim 9, Line 23, delete "Wherein" and substitute therefor -- wherein --;

Column 12, Claim 9, Line 25, delete "or" and substitute therefor -- on --;

Column 12, Claim 10, Line 1, delete "Wherein" and substitute therefor -- wherein --.

Signed and Sealed this
Twenty-sixth Day of November, 2024

Katherine Kelly Vidal
*Director of the United States Patent and Trademark Office*